United States Patent
Misra

(10) Patent No.: US 6,242,359 B1
(45) Date of Patent: Jun. 5, 2001

(54) PLASMA CLEANING AND ETCHING METHODS USING NON-GLOBAL-WARMING COMPOUNDS

(75) Inventor: Ashutosh Misra, Dallas, TX (US)

(73) Assignee: Air Liquide America Corporation, Houston, TX (US)

( * ) Notice: Subject to any disclaimer, the term of this patent is extended or adjusted under 35 U.S.C. 154(b) by 0 days.

(21) Appl. No.: 09/137,418

(22) Filed: Aug. 20, 1998

Related U.S. Application Data

(60) Provisional application No. 60/056,107, filed on Aug. 20, 1997.

(51) Int. Cl.[7] .................... H01L 21/3065; H01L 21/461; C09K 13/08
(52) U.S. Cl. .......................................... 438/710; 252/79.3
(58) Field of Search ................................ 252/79.1, 79.3; 438/905, 706, 707, 710, 719, 720, 721, 722, 723, 724, 726, 727, 729

(56) References Cited

U.S. PATENT DOCUMENTS

| | | | | |
|---|---|---|---|---|
| 4,581,101 | * | 4/1986 | Senoue et al. | 156/643 |
| 5,198,634 | * | 3/1993 | Mattson et al. | 219/121.43 |
| 5,281,302 | * | 1/1994 | Gabric et al. | 156/643 |
| 5,376,234 | * | 12/1994 | Yanagida et al. | 156/662 |
| 5,417,826 | * | 5/1995 | Blalock | 204/176 |
| 5,445,712 | * | 8/1995 | Yanagida | 156/662 |
| 5,679,215 | * | 10/1997 | Barnes et al. | 156/646.1 |
| 5,882,424 | * | 3/1999 | Taylor et al. | 134/1.1 |
| 5,897,377 | * | 4/1999 | Suzuki | 438/706 |
| 5,902,403 | * | 5/1999 | Aitani et al. | 118/723 |
| 5,925,611 | * | 7/1999 | Flynn et al. | 510/412 |
| 5,928,963 | * | 7/1999 | Koshiishi | 438/714 |

FOREIGN PATENT DOCUMENTS

| | | |
|---|---|---|
| 4232475 | 3/1994 | (DE) . |
| 08171686 | 11/1997 | (JP) . |

OTHER PUBLICATIONS

D. Wuebbles, "Weighing functions for ozone depletion and greenhouse gas effects on climate," *Annu. Rev. Energy Environment*, 1995, 20:45–70, pp. 61–62.

D. Harbison, "The New TI: An Overview of Texas Instruments,", *Channel Magazine*, Aug. 1998, pp. 14–15.

A. Misra et al, "Plasma etching of dielectric films using the non–global–warming gas $CF_3I$," *Materials Letters*, 34 (1998) pp. 415–419.

A. Misra et al, "X–ray photoelectron spectroscopy of aluminum alloys exposed to $CF_3I$ plasma," *Materials Letters*, 35 (1998) pp. 221–226.

Search Report issued in International Application No. PCT/US98/17191.

* cited by examiner

*Primary Examiner*—Benjamin L. Utech
*Assistant Examiner*—Matthew Anderson
(74) *Attorney, Agent, or Firm*—Burns, Doane, Swecker & Mathis, L.L.P.

(57) ABSTRACT

Provided is a novel method of cleaning a chemical vapor deposition processing chamber having deposits on an inner surface thereof is provided. The process involves forming a plasma from one or more gases comprising a fluorine-containing but otherwise halogen-free non-global-warming compound, and contacting active species generated in the plasma with the inner surface of the chamber, with the proviso that the non-global-warming compound is not trifluoroacetic anhydride. Also provided is a method of etching a layer on a silicon wafer. The method involves the steps of: (a) introducing a silicon wafer into a processing chamber, the silicon wafer comprising a layer to be etched; and (b) forming a plasma from one or more gases comprising a fluorine-containing but otherwise halogen-free non-global-warming compound. Active species generated in the plasma are contacted with the silicon wafer, thereby etching the layer, with the proviso that the non-global-warming compound is not trifluoroacetic anhydride. The chemistries in accordance with the invention provide environmentally benign alternatives to the conventionally used global-warming chemistries for chamber cleaning and semiconductor etching processes.

34 Claims, 1 Drawing Sheet

PLASMA CLEANING AND ETCHING METHODS USING NON-GLOBAL-WARMING COMPOUNDS

CROSS-REFERENCE TO RELATED APPLICATIONS

This application claims the benefit of priority under 35 U.S.C. §119(e) of U.S. provisional application no. 60/056,107, filed Aug. 20, 1997, the contents of which are herein incorporated by reference.

BACKGROUND OF THE INVENTION

1. Field of the Invention

The present invention relates to a method of cleaning a chemical vapor deposition processing chamber having deposits on an inner surface thereof. The invention also relates to a method of etching a layer on a silicon wafer. The inventive methods have particular applicability in semiconductor manufacturing.

2. Description of the Related Art

In the semiconductor manufacturing industry, extensive use is made of fluorinated gases which possess significant global-warming-potential (GWP). These compounds are commonly referred to as greenhouse gases or global-warming gases. Examples of such gases include, but are not limited to, fully fluorinated compounds, such as $CF_4$, $C_2F_6$, $C_3F_8$, $NF_3$ and $SF_6$, and partially fluorinated compounds, such as $CHF_3$.

As defined herein, the term global-warming compounds (GWCs) will be used to denote such compounds. These compounds typically have long atmospheric lifetimes and are efficient at absorbing infrared radiation, which contributes to the phenomena of global greenhouse effect.

The impact of a global-warming compound on climate change is measured by its global-warming-potential, which is described in D. Wuebbles, *Weighing functions for ozone depletion and greenhouse gas effects on climate, Annu. Rev. Energy Environment,* 1995, 20:45–70, the contents of which are herein incorporated by reference. As defined in that document and as used herein, GWP is expressed as the time-integrated radiative forcing from the instantaneous release of a kilogram (i.e., a small mass emission) of a trace gas expressed relative to that of a kilogram of the reference gas, $CO_2$, according to the following equation:

$$GWP(x) = \frac{\int_0^n a_x \cdot [x(t)] \, dt}{\int_0^n a_{CO_2} \cdot [CO_2(t)] \, dt}$$

where n is the time horizon over which the calculation is considered, $a_x$ is the climate-related, radiative-forcing response due to a unit increase in atmospheric concentration of the gas in question, and $[x(t)]$ is the time-decaying concentration of that gas and the corresponding quantities for the reference gas are in the denominator.

Many global-warming compounds are employed in the cleaning of semiconductor processing chambers. In plasma enhanced CVD (PECVD), gases are introduced into a processing chamber and a plasma is formed therefrom. Reactive species from the plasma form a film on the surface of one or more semiconductor wafers. During such processes, the film is formed not only on the wafers, but also on all exposed surfaces of the processing chamber. To clean the chamber, global-warming compounds are conventionally employed to form a plasma which removes the deposits.

Many global-warming compounds are also employed in etching processes, used to pattern dielectric and metal thin films formed on silicon wafers. In such processes, active species produced in a plasma react with exposed portions of the thin film to form a volatile product which diffuses away from the wafer surface.

When used in chamber cleaning and etching processes, the global-warming compounds generally do not react to completion. As a result, unreacted GWCs may be present in the exhaust removed from the processing tools.

It is well known and documented that GWCs are environmentally detrimental upon release into the atmosphere. In the Global Warming Symposium, Jun. 7–8, 1994, Dallas, Tex., $CF_4$, $C_2F_6$, $NF_3$ and $SF_6$ were identified as being greenhouse gases of particular concern in the semiconductor manufacturing industry.

The semiconductor manufacturing industry is currently exploring various means to reduce the emissions of such gases to minimize their environmental impact. Such attempts have included process optimization, abatement, recovery/recycle and the use of non-global-warming chemistries. While the use of new chemistries may be the most logical long term solution, it is perhaps the most difficult solution. This is because process integrity must be maintained with the use of any new chemistry. That is, the replacement chemistry should be able to perform as well as the chemistry it replaces. This is particularly important for the etching processes.

The use of iodo fluorocarbons, such as trifluoro iodomethane ($CF_3I$), has recently been proposed. The use of trifluoro iodomethane as an environmentally benign alternative chemistry in plasma processing is disclosed, for example, by Misra et al, *Plasma etching of dielectric films using the non-global-warming gas $CF_3I$, Materials Letters,* 34 (1998) 415–419 and by Misra et al, *X-ray photoelectron spectroscopy of aluminum alloys exposed to $CF_3I$ plasma, Materials Letters,* 35 (1998) 221–226, the contents of which articles are herein incorporated by reference.

While iodo fluorocarbons may prove to be a viable alternative to the use of global-warming gases in plasma processing, process engineers are nevertheless hesitant to use iodine-containing materials. This is due, in part, to the fact that iodine is not present in the materials conventionally employed in semiconductor processing. Hence, it is desirable to develop non-iodine containing alternatives to global-warming compounds based on constituents, the effects of which on the fabricated devices are well understood and established.

German Patent Document No. 4,232,475 A1 discloses a plasma dry-etching process employing, as the etching gas, compounds including a fluorine atom and an atom selected from chlorine, bromine and iodine, chemically bound to a carbon skeleton. The inclusion of halogen atoms in the gas compound in addition to fluorine is undesirable. As described above, the effects of iodine-containing materials on the final semiconductor device formed are not fully understood. Furthermore, brominated and chlorinated compounds are known ozone depleters, thus making them detrimental to the ozone layer.

Trifluoroacetic anhydride (TFAA), commercially available from Schumacher Company, has been proposed for use in PECVD chamber cleaning processes. However, the effects of this chemistry on electrical characteristics of the devices being formed is not fully understood. The development of other non-global-warming chemistries useful for chamber cleaning as well as for thin film etching is, therefore, desirable.

Furthermore, one drawback to the use of TFAA in chamber cleaning is its being a liquid at standard temperature and pressure. As a result, TFAA requires a special chemical delivery system for introduction into the processing chamber. Since CVD systems are typically designed to handle gas-phase chemistries, the use of a liquid-phase chemistry would require a vaporizer structure, in addition to a different type of mass flow controller (MFC) and other monitoring devices from those conventionally used. Further, liquid droplets may be entrained in the vaporized material, thereby leading to processing abnormalities. While the present invention also contemplates liquid chemistries, the development of a gas-phase chemistry is desirable for hardware simplification purposes.

To meet the requirements of the semiconductor manufacturing industry and to overcome the disadvantages of the related art, it is an object of the present invention to provide a novel method for cleaning a chemical vapor deposition processing chamber having deposits on an inner surface thereof.

It is also an object of the present invention to provide a method of etching a layer, for example, a dielectric or a metal layer, on a silicon wafer.

As a result of the invention, the release of global-warming compounds into the atmosphere and the environmental damage associated therewith can be avoided or conspicuously ameliorated.

Other objects and advantages of the present invention will become apparent to one of ordinary skill in the art upon review of the specification, drawings and claims appended hereto.

SUMMARY OF THE INVENTION

The foregoing objectives are met by the methods of the present invention. According to a first aspect of the present invention, a novel method of cleaning a chemical vapor deposition processing chamber having deposits on an inner surface thereof is provided. The process comprises forming a plasma from one or more gases comprising a fluorine-containing but otherwise halogen-free non-global-warming compound, and contacting active species generated in the plasma with the inner surface of the chamber, with the proviso that the non-global-warming compound is not trifluoroacetic anhydride.

According to a second aspect of the invention, a method of cleaning a plasma enhanced chemical vapor deposition processing chamber is provided. The method comprises the steps of introducing hexafluoropropene oxide ($CF_3CFOCF_2$) into the processing chamber and forming a plasma, thereby cleaning the processing chamber.

According to a third aspect of the invention, a method of etching a layer on a silicon wafer is provided. The method comprises the steps of: (a) introducing a silicon wafer into a processing chamber, the silicon wafer comprising a layer to be etched; and (b) forming a plasma from one or more gases comprising a fluorine-containing but otherwise halogen-free non-global-warming compound. Active species generated in the plasma are contacted with the silicon wafer, thereby etching the layer, with the proviso that the non-global-warming compound is not trifluoroacetic anhydride.

According to a fourth aspect of the invention, a method of etching a dielectric or metal film on a silicon wafer is provided. The method comprises the steps of introducing a silicon wafer having a dielectric or metal film into a processing chamber, introducing hexafluoropropene oxide ($CF_3CFOCF_2$) into the processing chamber and forming a plasma, thereby etching the dielectric or metal film.

The chemistries in accordance with the invention provide environmentally benign alternatives to the conventionally used global-warming compounds for chamber cleaning or semiconductor etching processes.

BRIEF DESCRIPTION OF THE DRAWINGS

The objects and advantages of the invention will become apparent from the following detailed description of the preferred embodiments thereof in connection with the accompanying drawings, in which.

DETAILED DESCRIPTION OF THE PREFERRED EMBODIMENTS OF THE INVENTION

Figure 1:
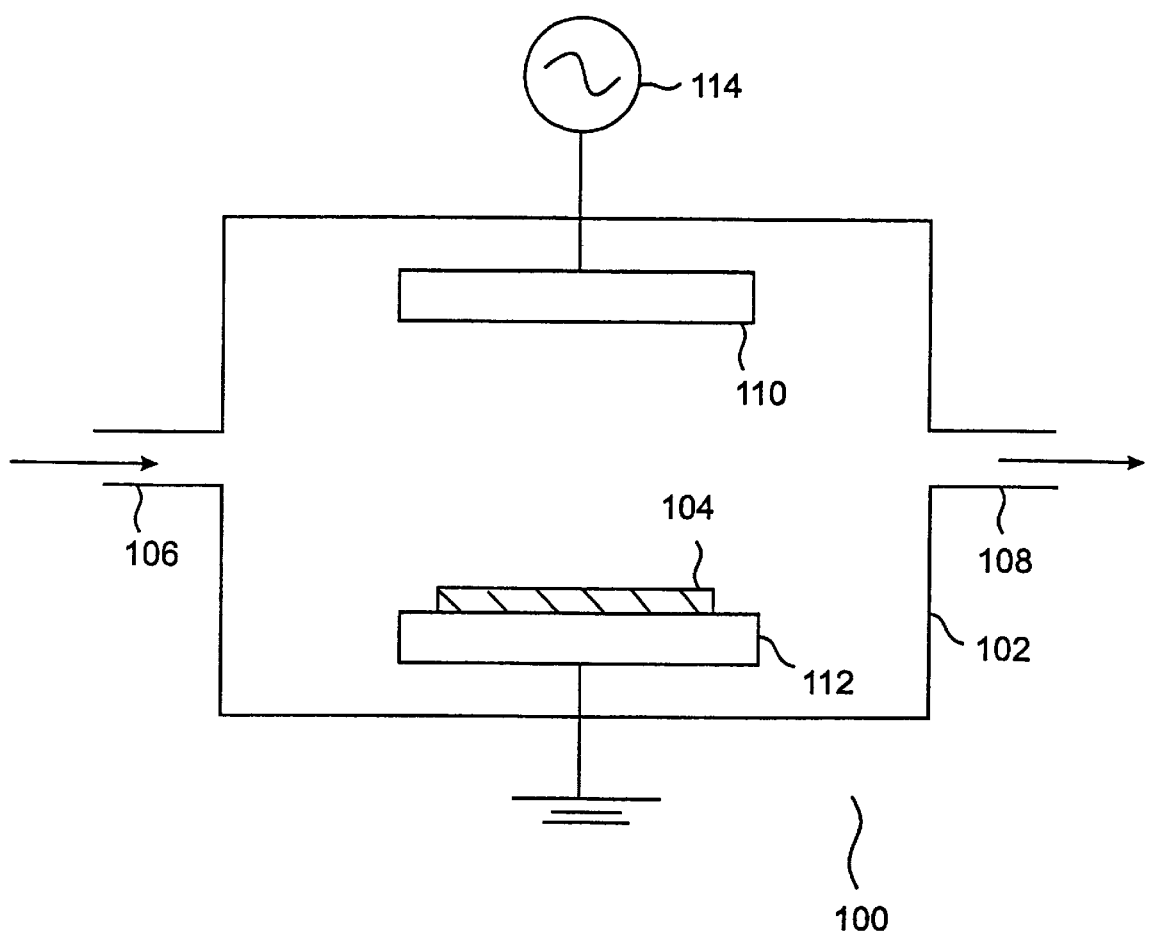
FIG. 1 illustrates a conventional plasma processing tool which can be used to practice the methods in accordance with the invention.

The invention is based, in part, on the theory that replacement of a carbon-fluorine bond in various global-warming compounds with a weaker bond provides a more chemically and photo chemically active compound. The result is enhanced breakdown of the compound by chemical reaction mechanisms in the earth's atmosphere, and hence, a compound possessing a low global-warming-potential, i.e., a non-global-warming compound.

As used herein, the term non-global-warming compound means a compound having a global-warming-potential of less than 1000, preferably less than 100 and more preferably less than 20.

An exemplary chemistry in accordance with the invention involves replacing one or more carbon-fluorine bonds in a global-warming compound with a carbon-oxygen bond. As carbon-oxygen bonds are significantly weaker than carbon-fluorine bonds, compounds containing such bonds can be expected to possess low global-warming-potentials. In addition to their possessing low global-warming-potentials, the dissociation products of these compounds in a plasma are similar to those produced from traditional global-warming based chemistries, for example, $CF_4$ and $C_2F_6$. Consequently, etching of dielectric and metallic materials can be successfully achieved without detrimentally affecting the environment.

Moreover, as a result of the relative weakness of the carbon-oxygen bond, such compounds are typically dissociated to a greater extent in the plasma than the traditionally used global-warming chemistries. Consequently, a greater concentration of atomic, molecular, radical and ionic species can be produced in the plasma, resulting in enhanced etching rates of the films being treated.

The compounds employed in the invention consist of elements employed in typical semiconductor process gases. This is an improvement over compounds containing iodine, for example iodo fluorocarbons, the effects of which on the processes and devices formed is not fully understood.

Furthermore, the compounds employed in the invention are free of halogens other than fluorine. This is an important feature of the invention since the release into the atmosphere of compounds containing halogens other than fluorine, for example, bromine and chlorine, can lead to ozone depletion.

Exemplary compounds useful in the chamber cleaning and etching methods of the invention include, but are not limited to, hexafluoropropene oxide ($CF_3CFOCF_2$), perfluoropropane-dial ($CFOCF_2CFO$), trifluoromethanol ($CF_3OH$), difluoromethanol ($CHF_2OH$), difluoro oxyfluoro methane ($CHF_2OF$), perfluorodiethyl ether ($C_2F_5OC_2F_5$), 1,1,3,3-tetrafluorodimethyl ether ($CHF_2OCHF_2$), 1,2,2,2-tetrafluoroethyl difluoromethyl ether ($CF_3CHFOCHF_2$), hexafluorodimethyl ether ($CF_3OCF_3$), hexafluorodivinyl ether ($CF_2CFOCFCF_2$), heptafluoropropyl trifluorovinyl ether ($C_3F_7OCFCF_2$), perfluoromethylvinyl ether ($CF_3OCFCF_2$), 1,1,2,3,3,3-hexafluoro-1-propene ($CF_3CFCF_2$), hexafluorocyclopropane ($CF_2CF_2CF_2$), 1,1,1,3,3,3-hexafluoroisopropanol ($(CF_3)_2CHOH$), hexafluoro-2-trifluoromethyl-2-propanol ($(CF_3)_3COH$), 1,2,2-trifluoroethyl trifluoromethyl ether ($CF_3OCF_2CHF_2$), 1,1,2,2-tetrafluoroethanol ($CHF_2CF_2OH$), 1,1,2,2-tetrafluoro ethanediol ($CF_2OHCF_2OH$), 1,1,3,3-tetrafluoroprop-1,2-diene ($CF_2CCF_2$), pentafluoropropionyl fluoride ($CF_3CF_2CFO$), 2,2-difluoro-3,3-bis(trifluoromethyl)oxirane ($CF_2OC(CF_3)_2$), trifluoroacetyl fluoride ($CF_3CFO$), acetyl fluoride ($CH_3CFO$), octafluorocyclopentene ($C_5F_8$), oxalyl fluoride ($(COF)_2$), 1,1,1-trifluoroacetone ($CF_3COCH_3$) or combinations thereof.

In accordance with a particularly preferred aspect of the invention, the non-global-warming compound is a single-phase gas at standard temperature and pressure. Use of gas-phase materials renders unnecessary the need for the chemical delivery and monitoring systems associated with liquid chemicals. Moreover, the difficulty and cost of retro-fitting existing processing tools to accept such additional equipment can be avoided.

Preferred non-global-warming compounds which are single-phase gases at standard temperature and pressure include, for example, hexafluoropropene oxide ($CF_3CFOCF_2$), 1,2,2,2-tetrafluoroethyl difluoromethyl ether ($CF_3CHFOCHF_2$), 1,1,3,3-tetrafluoroprop-1,2-diene ($CF_2CCF_2$), 1,2,2,2-tetrafluoroethyl difluoromethyl ether ($CF_3CHFOCHF_2$), perfluoromethylvinyl ether ($CF_3OCFCF_2$), 1,1,2,3,3,3-hexafluoro-1-propene ($CF_3CFCF_2$), pentafluoropropionyl fluoride ($CF_3CF_2CFO$), 2,2-difluoro-3,3-bis(trifluoromethyl)oxirane ($CF_2OC(CF_3)_2$), trifluoroacetyl fluoride ($CF_3CFO$), acetyl fluoride ($CH_3CFO$), octafluorocyclopentene ($C_5F_8$), oxalyl fluoride ($(COF)_2$), 1,1,1-trifluoroacetone ($CF_3COCH_3$) or combinations thereof.

Also preferred are those compounds not containing terminal $CF_3$ groups. During plasma processing, the process materials dissociate into charged and uncharged radicals. Compounds containing terminal $CF_3$ groups form $CF_3$ radicals as well as free F radicals, the combination of which can form $CF_4$. Since $CF_4$ is itself a global-warming compound, the avoidance of compounds containing terminal $CF_3$ groups is preferred.

The invention will now be described generally with reference to FIG. 1, which illustrates a semiconductor plasma processing tool with which the inventive methods can be practiced. It should be clear that this figure is merely exemplary, and that the invention is in no way limited thereto.

The exemplary processing tool 100 is a capacitively coupled system for performing PECVD and/or etching processes. The processing tool 100 includes a processing chamber 102 inside which a semiconductor wafer 104 is disposed during CVD or etching processing. One or more gas inlets 106 are provided for introducing the non-global-warming compound and any additional process gas or a plurality of gases into the processing chamber. The gas inlets are connected to respective sources for providing the gases to the processing chamber.

Processing chamber 102 further contains an upper electrode 110 and a lower electrode 112 for generation of a plasma. The lower electrode 110 further acts as a support for holding semiconductor wafer 104 during the CVD or etching process. In the exemplified processing tool, upper electrode 110 is connected to an RF power supply 114 and electrode 112 is connected to ground.

Processing chamber 102 is evacuated through an exhaust port 108. A vacuum pump (not shown) for evacuating the processing chamber can be connected thereto. Examples of vacuum pumps which may be employed are mechanical rotary and booster pumps, diffusion pumps, cryogenic pumps, sorption pumps and turbomolecular pumps. The pump exhaust is typically sent to a gas scrubber or other gas treatment device before it is released into the atmosphere.

The means for delivering the non-global-warming compound into the processing chamber will depend on the characteristics of that compound at standard conditions. In the case of a compound which is in a single-phase gas state at standard temperature and pressure, or a liquid material which has a sufficiently high vapor pressure, the source material can be contained in a gas cylinder or a bulk storage vessel connected to the chamber by gas piping containing valves and other necessary flow control devices, such as mass flow controllers (MFCs).

On the other hand, materials which are in the liquid state at standard conditions and which have relatively low vapor pressures can be supplied to the processing chamber in the gas state by employing a vaporizer. The vaporizer allows the liquid chemical to be heated to a temperature sufficient to vaporize the liquid allowing it to be introduced into the processing chamber as a gas.

The vaporizer can optionally be used in combination with a carrier gas bubbled through the chemical. In such a case, the carrier gas can be an inert gas, such as nitrogen or argon. Alternatively, if a process gas in addition to the non-global-warming compound (e.g., an oxygen-containing gas, described below) is employed, it can be used as the carrier gas.

To facilitate the plasma cleaning or etching process, an oxygen-containing gas can optionally be introduced into the processing tool as an additional plasma generation gas. The presence of oxygen in the plasma improves etching selectivity and enhances removal rates of the material being etched due to enhanced formation of active chemical species. Suitable oxygen-containing gases include, for example, oxygen, ozone, nitrous oxide and nitric oxide.

The method in accordance with the invention will now be described with reference to the cleaning of a chemical vapor deposition processing chamber. While PECVD methods readily lend themselves to the inventive method, the CVD deposition method itself may be a non-plasma process, for example, a non-plasma low pressure CVD method. In this instance, the CVD processing tool must include a plasma generator to effect the inventive method.

The deposits formed during the CVD process on exposed surfaces of the processing chamber can include dielectric or metal materials. Dielectric materials include, for example, doped and undoped silicon oxides, silicon nitride and silicon oxynitride. As used herein, the terms "silicon oxide," "silicon nitride" and "silicon oxynitride" are intended to encompass both stoichiometric and non-stoichiometric type materials. The metal films that can be deposited in the CVD process include, for example, tungsten, aluminum and copper.

The cleaning method is performed between CVD processes and is therefore performed with no wafers present in the processing chamber. In accordance with the method, one or more of the above-described non-global-warming compounds is introduced into the processing chamber 102, optionally with an oxygen-containing gas as described above. A plasma is then formed from the introduced gases. Active species generated in the plasma are contacted with the inner surfaces of the chamber, and the deposits are effectively removed thereby.

The process conditions during the chamber cleaning method will depend on factors, such as the type of deposit being removed and the type of plasma generation system being employed. While such conditions can be determined by persons skilled in the art, typical conditions can be summarized as follows:

Pressure: 50 mTorr to 10 Torr;
RF power: 500 watts to 3000 watts;
Non-global-warming compound flow rate: 100 sccm to 2000 sccm; and
Oxygen/non-global-warming compound ratio: 0 to 2.

The invention will now be described with reference to an etching process in which a thin film, such as a dielectric or metal layer, on a semiconductor wafer is etched. In accordance with this method, a silicon wafer 104 is introduced into the etching chamber 102 of the etching tool 100. Next, one or more of the non-global-warming compounds is introduced into the processing chamber 102, optionally with an oxygen-containing gas. A plasma is then formed from the introduced gases. Active species generated in the plasma are contacted with the layer to be etched and interact chemically and/or physically to remove exposed portions of the layer.

As with the chamber cleaning process, the etching process conditions will depend on various factors. For example, the conditions will depend on the etching gases, the type of film being etched and the type of plasma generation system being employed. As with the chamber cleaning method, suitable process conditions can readily be determined by persons skilled in the art. Typical process conditions for the etching method can be summarized as follows:

Pressure: 5 mTorr to 10 Torr;
RF power: 200 watts to 3000 watts;
Non-global-warming compound flow rate: 50 sccm to 2000 sccm; and
Oxygen/non-global-warming compound ratio: 0 to 2.

Although the above-described methods have been described with reference to the capacitively coupled plasma generation system of FIG. 1, the methods in accordance with the invention can be practiced with other types of plasma generation systems, such as inductively coupled plasma (ICP) based systems, and microwave plasma generation systems of the electron cyclotron resonance (ECR) or the non-ECR type. Examples of plasma generation systems useful with the inventive method are described in *Applications of Plasma Processes to VLSI Technoloqy*, T. Sugano, John Wiley & Sons, 1980, pp. 102–215, the contents of which are herein incorporated by reference.

The present invention further contemplates plasma generation inside the semiconductor processing chamber itself as illustrated in FIG. 1 or, alternatively, in a separate chamber from or otherwise remotely located from the wafer. Systems based on the latter type of plasma generation are conventionally called downstream, afterglow or remote plasma processing tools. They are advantageous in that radiation damage to the substrate from high energy species in the plasma can be avoided.

While the invention has been described in detail with reference to specific embodiments thereof, it will be apparent to those skilled in the art that various changes and modifications can be made, and equivalents employed, without departing from the scope of the appended claims.

What is claimed is:

1. A method of cleaning a chemical vapor deposition processing chamber having deposits on an inner surface thereof, comprising forming a plasma from one or more gases comprising a fluorine-containing but otherwise halogen-free non-global-warming compound, and contacting active species generated in the plasma with the inner surface of the chamber, wherein the non-global warming compound is trifluoromethanol ($CF_3OH$), difluoromethanol ($CHF_2OH$), 1,1,1,3,3,3-hexafluoroisopropanol (($CF_3)_2$CHOH), hexafluoro-2-trifluoromethyl-2-propanol (($CF_3)_3$COH), 1,1,2,2-tetrafluoro ethanediol ($CF_2OHCF_2OH$) or combinations thereof.

2. The method of claim 1, wherein the one or more gases further comprise an oxygen-containing gas different from the non-global-warming compound.

3. The method of claim 2, wherein the oxygen-containing gas is ozone or nitric oxide.

4. The method of claim 1, wherein the deposits on the inner surface of the processing chamber comprise a silicon oxide or silicon nitride.

5. The method of claim 1, wherein the deposits on the inner surface of the processing chamber comprise aluminum, copper or tungsten.

6. The method of claim 1, wherein the plasma is generated inside the processing chamber.

7. The method of claim 1, wherein the plasma is generated upstream from the processing chamber.

8. The method of claim 1, wherein the plasma is a microwave generated or inductively coupled plasma.

9. The method of claim 1, wherein the plasma is an RF capacitively coupled plasma.

10. A method of etching a layer on a silicon wafer, comprising the steps of:
    (a) introducing a silicon wafer into a processing chamber, the silicon wafer comprising a layer to be etched; and
    (b) forming a plasma from one or more gases comprising a fluorine-containing but otherwise halogen-free non-global-warming compound, and contacting active species generated in the plasma with the silicon wafer, thereby etching the layer, wherein the non-global warming compound is trifluoromethanol ($CF_3OH$), difluoromethanol ($CHF_2OH$), 1,1,1,3,3,3-hexafluoroisopropanol (($CF_3)_2$CHOH), hexafluoro-2-trifluoromethyl-2-propanol (($CF_3)_3$COH), 1,1,2,2-tetrafluoroethanol ($CHF_2CF_2OH$), 1,1,2,2-tetrafluoro ethanediol ($CF_2OHCF_2OH$) or combinations thereof.

11. The method of claim 10, wherein the layer is a dielectric layer.

12. The method of claim 11, wherein the layer is a silicon oxide, silicon nitride or silicon oxynitride layer.

13. The method of claim 10, wherein the layer is a metal layer.

14. The method of claim 13, wherein the layer comprises aluminum, copper or tungsten.

15. The method of claim 10, wherein the one or more gases further comprise an oxygen-containing gas different from the non-global-warming compound.

16. The method of claim 15, wherein the oxygen-containing gas is ozone or nitric oxide.

17. The method of claim 15, wherein the plasma is generated inside the processing chamber.

18. The method of claim 15, wherein the plasma is generated upstream from the processing chamber.

19. The method of claim 15, wherein the plasma is a microwave generated or inductively coupled plasma.

20. The method of claim 15, wherein the plasma is an RF capacitively coupled plasma.

21. A method of etching a metal layer on a silicon wafer, comprising the steps of:
(a) introducing a silicon wafer into a processing chamber, the silicon wafer comprising a metal layer to be etched; and
(b) forming a plasma from one or more gases comprising a fluorine-containing but otherwise halogen-free non-global-warming compound, and contacting active species generated in the plasma with the silicon wafer, thereby etching the metal layer, wherein the non-global warming compound is perfluoropropane dial ($CFOCF_2CFO$), pentafluoropropionyl fluoride ($CF_3CF_2CFO$), trifluoroacetyl fluoride ($CF_3CFO$), acetyl fluoride ($CH_3CFO$), oxalyl fluoride (($COF)_2$), 1,1,1-trifluoroacetone ($CF_3COCH_3$) or combinations thereof.

22. The method of claim 21, wherein the layer comprises aluminum, copper or tungsten.

23. The method of claim 21, wherein the one or more gases further comprise an oxygen-containing gas different from the non-global-warming compound.

24. The method of claim 23, wherein the plasma is generated inside the processing chamber.

25. The method of claim 23, wherein the plasma is generated upstream from the processing chamber.

26. The method of claim 23, wherein the plasma is a microwave generated or inductively coupled plasma.

27. The method of claim 23, wherein the plasma is an RF capacitively coupled plasma.

28. A method of etching a metal layer on a silicon wafer, comprising the steps of:
(a) introducing a silicon wafer into a processing chamber, the silicon wafer comprising a metal layer to be etched; and
(b) forming a plasma from one or more gases comprising a fluorine-containing but otherwise halogen-free non-global-warming compound, and contacting active species generated in the plasma with the silicon wafer, thereby etching the metal layer, wherein the non-global warming compound is 1,1,3,3-tetrafluoroprop-1,2-diene ($CF_2CCF_2$), difluoro oxyfluoro methane ($CHF_2OF$), 1,1,2,3,3,3-hexafluoro-1-propene ($CF_3CFCF_2$), octafluorocyclopentene ($C_5F_8$), hexafluorocyclopropane ($CF_2CF_2CF_2$) or combinations thereof.

29. The method of claim 28, wherein the layer comprises aluminum, copper or tungsten.

30. The method of claim 28, wherein the one or more gases further comprise an oxygen-containing gas different from the non-global-warming compound.

31. The method of claim 30, wherein the plasma is generated inside the processing chamber.

32. The method of claim 30, wherein the plasma is generated upstream from the processing chamber.

33. The method of claim 30, wherein the plasma is a microwave generated or inductively coupled plasma.

34. The method of claim 30, wherein the plasma is an RF capacitively coupled plasma.

* * * * *